(12) United States Patent
Li et al.

(10) Patent No.: US 11,398,808 B2
(45) Date of Patent: Jul. 26, 2022

(54) METHOD FOR GENERATING HIGH ORDER HARMONIC FREQUENCIES AND MEMS RESONATOR

(71) Applicant: NATIONAL TSING HUA UNIVERSITY, Hsinchu (TW)

(72) Inventors: Sheng-Shian Li, Taoyuan (TW); Gayathri Pillai, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 401 days.

(21) Appl. No.: 16/578,422

(22) Filed: Sep. 23, 2019

(65) Prior Publication Data
US 2020/0382097 A1    Dec. 3, 2020

(30) Foreign Application Priority Data
May 30, 2019   (TW) .................. 108118798

(51) Int. Cl.
*H03H 9/02* (2006.01)
*H03H 9/13* (2006.01)
*H03H 9/17* (2006.01)
*H03H 9/15* (2006.01)

(52) U.S. Cl.
CPC .......... *H03H 9/02259* (2013.01); *H03H 9/13* (2013.01); *H03H 9/176* (2013.01); *H03H 2009/155* (2013.01)

(58) Field of Classification Search
CPC ...... H03H 9/02259; H03H 9/13; H03H 9/176; H03H 9/2426; H03H 9/02275; H03H 2009/155; H03H 2009/02488; H03B 5/32; H03B 25/00
See application file for complete search history.

(56) References Cited

U.S. PATENT DOCUMENTS

| 9,024,708 | B2 * | 5/2015 | Li | H03H 9/2436 333/186 |
| 2010/0000292 | A1 * | 1/2010 | Karabacak | G01N 29/022 73/24.01 |
| 2012/0286886 | A1 * | 11/2012 | Kim | H03H 9/2426 331/107 DP |

* cited by examiner

*Primary Examiner* — Jeffrey M Shin
(74) *Attorney, Agent, or Firm* — CKC & Partners Co., LLC

(57) ABSTRACT

A method for generating high order harmonic frequencies includes: providing a piezoelectric resonant film; and inputting a driving signal with a single tone frequency for driving the piezoelectric resonant film to oscillate in a non-linear region so as to generate a plurality of high order harmonic frequencies. Therefore, the quantity of the high order harmonic frequencies can be adjusted by applying an electrical controlling method.

15 Claims, 22 Drawing Sheets

METHOD FOR GENERATING HIGH ORDER HARMONIC FREQUENCIES AND MEMS RESONATOR

RELATED APPLICATIONS

This application claims priority to Taiwan Application Serial Number 108118798, filed May 30, 2019, which is herein incorporated by reference.

BACKGROUND

Technical Field

The present disclosure relates to a method for generating high order harmonic frequencies and MEMS resonator. More particularly, the present disclosure relates to a method that utilizing a non-linear characteristic of a MEMS resonator for generating high order harmonic frequencies and a structure of the MEMS resonator.

Description of Related Art

A quartz oscillator is commonly used in the modern electronic device. Owing to the demands on the compact size, long usage time and high efficiency, the quartz oscillator suffers challenges on compact size, low power consumption, high accuracy and high reliability. Due to the progress of the semiconductor technology, it is a trend that using a MEMS (micro-electromechanical system) to replace the quartz oscillator. The MEMS can reduce the size of a mechanical device or system to a micro scale. Furthermore, an electrical method can be used to activate the MEMS and read a signal thereof. Therefore, MEMS resonator is widely applied in the electronic device that requiring time-dependent frequency, such as a smart phone, a computer device, a camera, a clock, a mainboard, etc.

The time-dependent frequency of the MEMS resonator can be divided into two regions, a linear region and a non-linear region. However, high order harmonic frequencies generated in the non-linear region still cannot be well controlled nowadays. Therefore, there is a need to develop a method that can control the quantity of the harmonic frequencies generated in the non-linear region.

SUMMARY

According to one aspect of the present disclosure, a method for generating high order harmonic frequencies is provided. The method includes: providing a piezoelectric resonant film; and inputting a driving signal with a single tone frequency for driving the piezoelectric resonant film to oscillate in a non-linear region so as to generate a plurality of high order harmonic frequencies.

According to another aspect of the present disclosure, a method for generating high order harmonic frequencies is provided. The method includes: providing a piezoelectric resonant film; and inputting a driving signal with a frequency sweep range for driving the piezoelectric resonant film to oscillate in a non-linear region so as to generate a plurality of high order harmonic frequencies.

According to still another aspect of the present disclosure, a method for generating high order harmonic frequencies is provided. The method includes: providing a piezoelectric resonant film; inputting a driving signal to the piezoelectric resonant film for driving the piezoelectric resonant film to oscillate in a non-linear region so as to generate a plurality of high order harmonic frequencies; and inputting a DC bias to the piezoelectric resonant film for adjusting a quantity of the high order harmonic frequencies.

According to further another aspect of the present disclosure, a MEMS resonator is provided. The MEMS resonator includes a bottom electrode, a piezoelectric resonant film, a first top electrode and a second top electrode. The piezoelectric resonant film is located on the bottom electrode, wherein the piezoelectric resonant film includes an equivalent high stiffness region and an equivalent low stiffness region. The first top electrode is located on the equivalent low stiffness region. The second top electrode is located on the equivalent high stiffness region. Wherein a driving signal is inputted from the first top electrode or the second top electrode for driving the piezoelectric resonant film to oscillate in a non-linear region so as to generate a plurality of high order harmonic frequencies.

DETAILED DESCRIPTION

Figure 1:
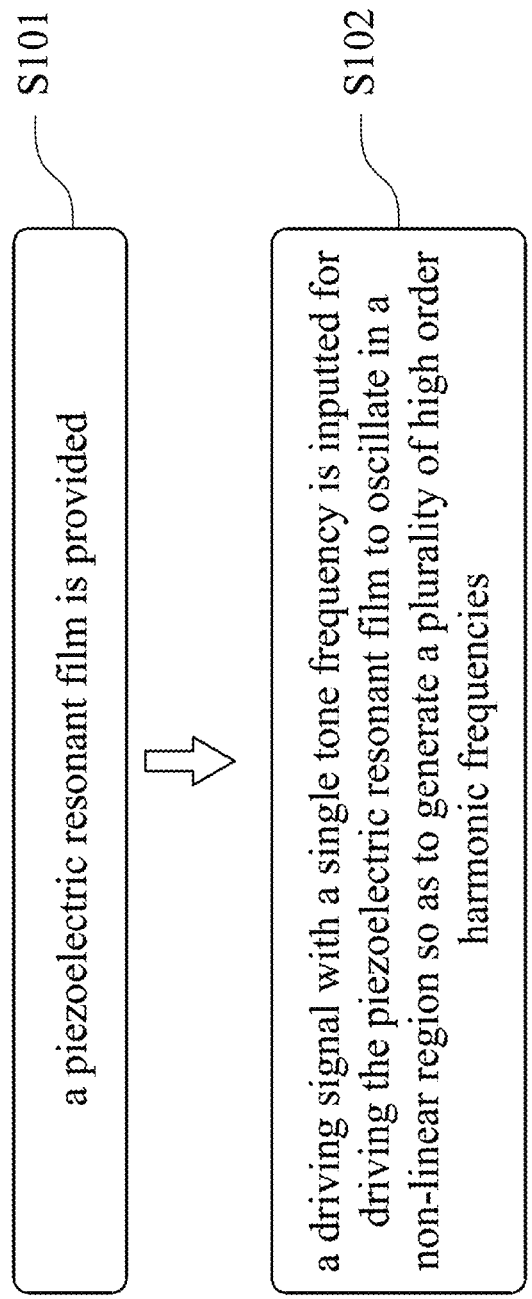
FIG. 1 is a flow chart showing a method for generating high order harmonic frequencies according to one embodiment of the present disclosure.
Figure 2:
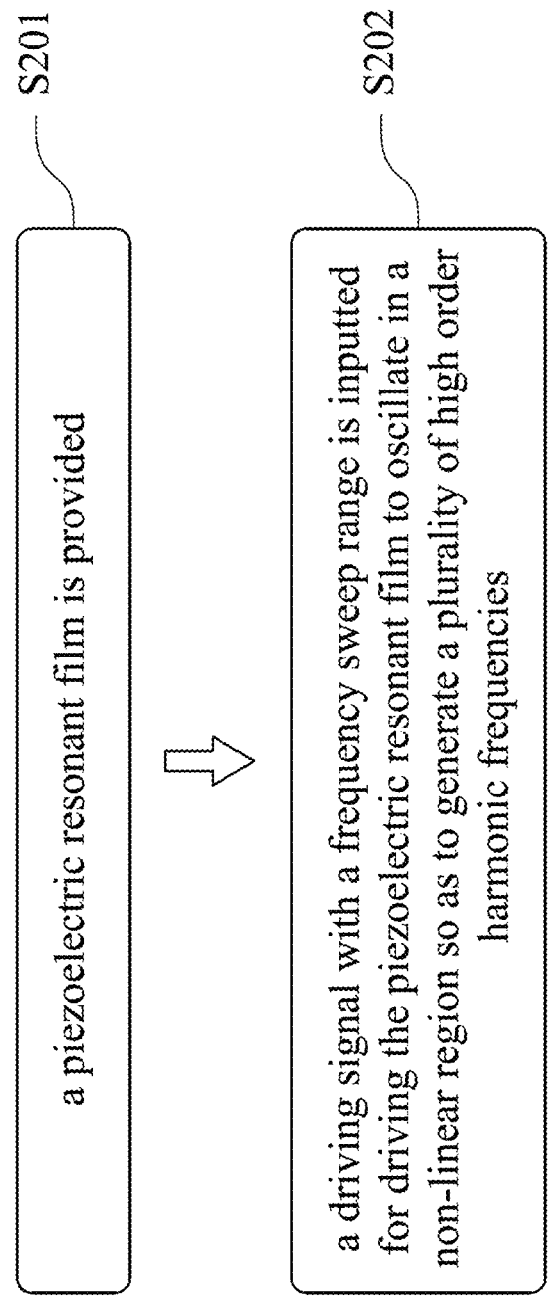
FIG. 2 is a flow chart showing a method for generating high order harmonic frequencies according to another embodiment of the present disclosure.
Figure 3:
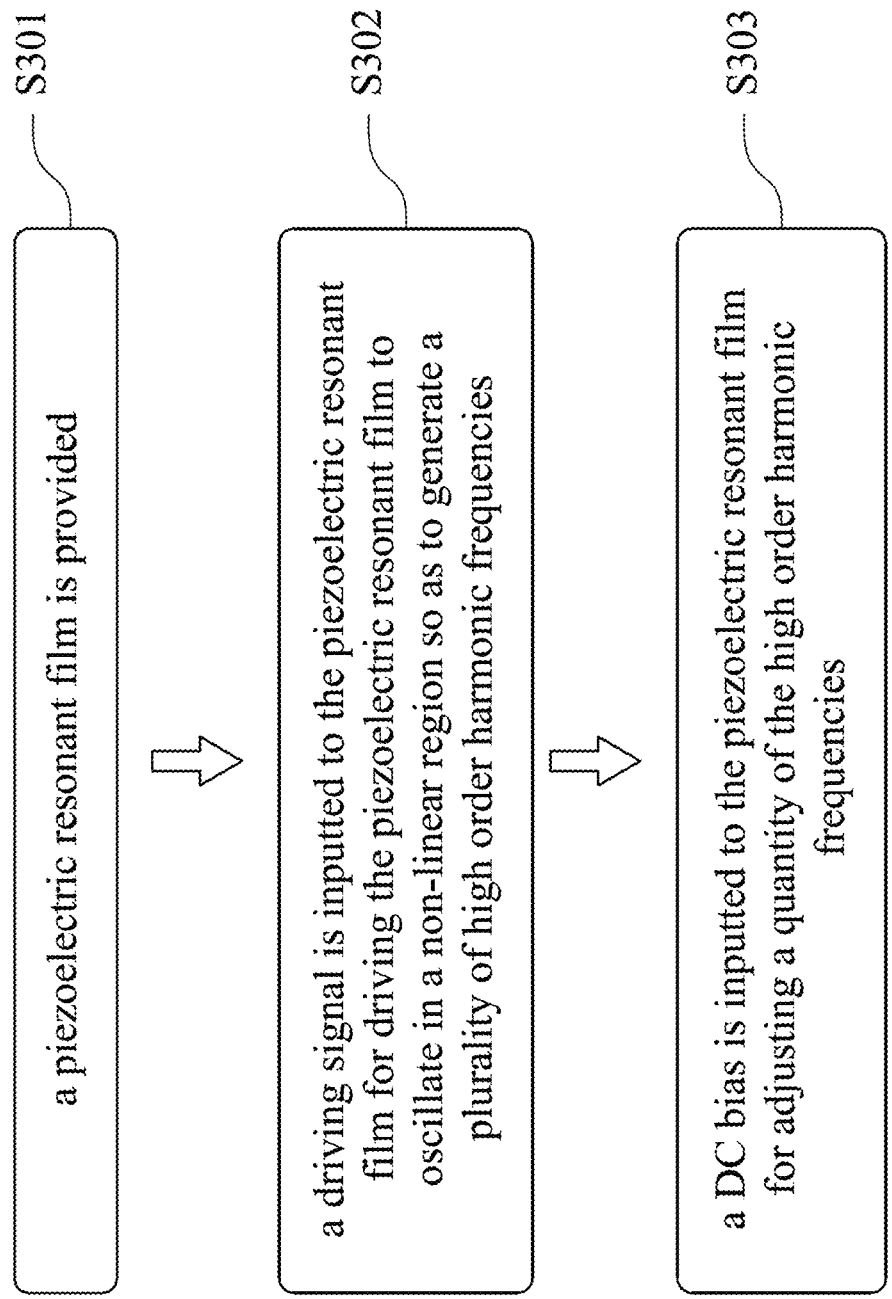
FIG. 3 is a flow chart showing a method for generating high order harmonic frequencies according to still another embodiment of the present disclosure.

FIG. 1 is a flow chart showing a method for generating high order harmonic frequencies according to one embodiment of the present disclosure. FIG. 2 is a flow chart showing a method for generating high order harmonic frequencies according to another embodiment of the present disclosure. FIG. 3 is a flow chart showing a method for generating high order harmonic frequencies according to still another embodiment of the present disclosure.

In FIG. 1, the method for generating high order harmonic frequencies includes steps as follow. In step S101, a piezoelectric resonant film is provided. In step S102, a driving signal with a single tone frequency is inputted for driving the piezoelectric resonant film to oscillate in a non-linear region so as to generate a plurality of high order harmonic frequencies.

In FIG. 2, the method for generating high order harmonic frequencies includes steps as follow. In step S201, a piezoelectric resonant film is provided. In step S202, a driving signal with a frequency sweep range is inputted for driving the piezoelectric resonant film to oscillate in a non-linear region so as to generate a plurality of high order harmonic frequencies.

In FIG. 3, the method for generating high order harmonic frequencies includes steps as follow. In step S301, a piezoelectric resonant film is provided. In step S302, a driving signal is inputted to the piezoelectric resonant film for driving the piezoelectric resonant film to oscillate in a non-linear region so as to generate a plurality of high order harmonic frequencies. In step S303, a DC bias is inputted to the piezoelectric resonant film for adjusting a quantity of the high order harmonic frequencies. According to the embodiments of FIG. 1, FIG. 2 and FIG. 3, the piezoelectric resonant film can include an equivalent high stiffness region and an equivalent low stiffness region. More details of the equivalent high stiffness region and the equivalent low stiffness region will be described in the following paragraphs.

From FIG. 1, FIG. 2 and FIG. 3, it is shown that the quantity of the high order harmonic frequencies can be controlled by various methods. For example, the piezoelectric resonant film can be driven form the equivalent high stiffness region or the equivalent low stiffness region, and the driving signal can be a single tone frequency or a frequency sweep range. Furthermore, the quantity of the high order harmonic frequencies can also be controlled by inputting a DC bias or by controlling a frequency offset value of the driving signal. The structure of the MEMS resonator and the operation mechanism thereof are then described.

Figure 4:
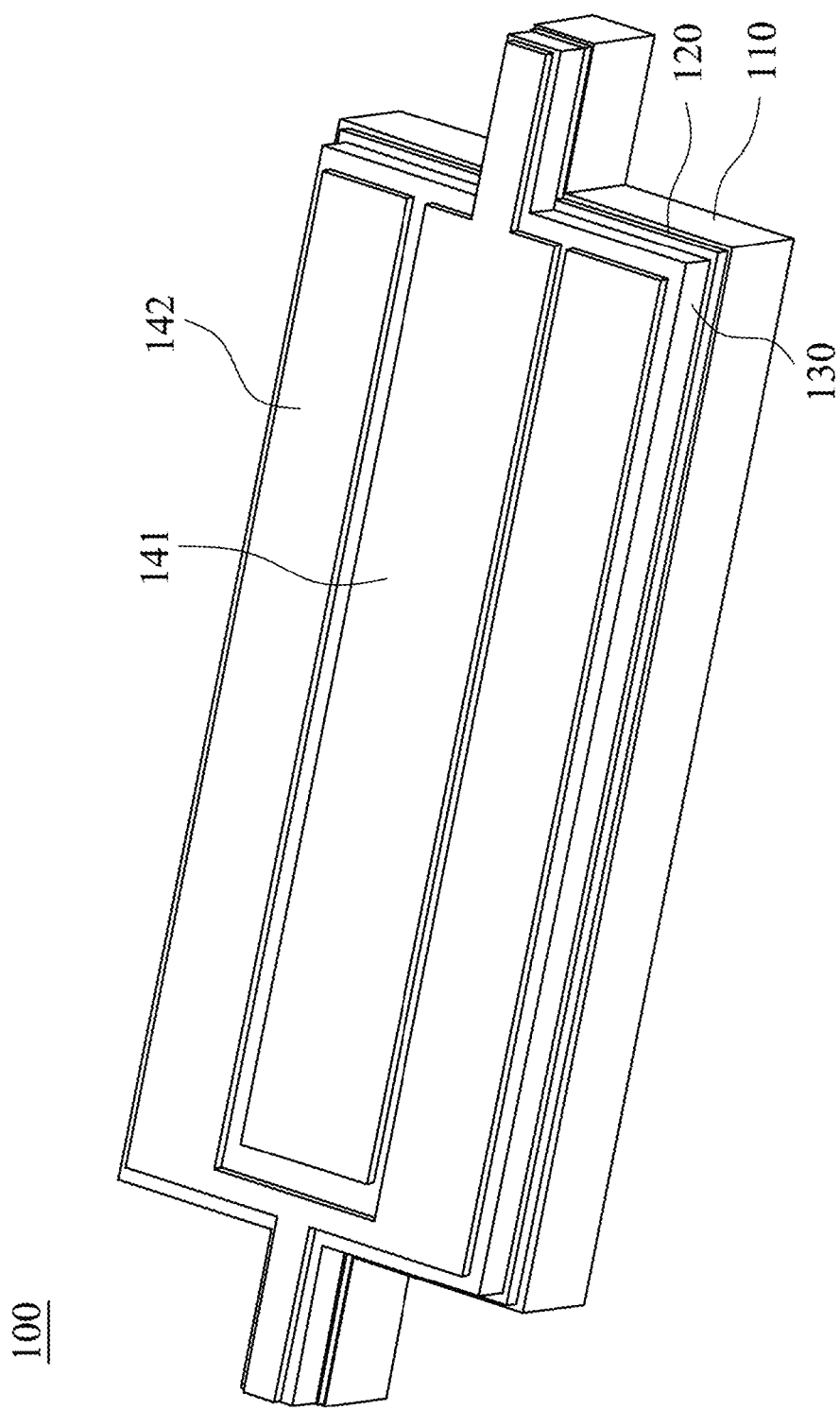
FIG. 4 is a schematic view showing a structure of a MEMS resonator according to one embodiment of the present disclosure.

FIG. 4 is a schematic view showing a structure of a MEMS resonator 100 according to one embodiment of the present disclosure. In the present disclosure, the MEMS resonator 100 used for generating high order harmonic frequencies includes a bottom electrode 120, a piezoelectric resonant film 130, a first top electrode 141 and a second top electrode 142. The piezoelectric resonant film 130 is located on the bottom electrode 120. The piezoelectric resonant film 130 includes an equivalent high stiffness region and an equivalent low stiffness region. The first top electrode 141 is located on the equivalent low stiffness region of the piezoelectric resonant film 130. The second top electrode 142 is located on the equivalent high stiffness region of the piezoelectric resonant film 130. When the first top electrode 141 or the second top electrode 142 receives a driving signal with a single tone frequency or a frequency sweep range, the piezoelectric resonant film 130 is driven to oscillate in a non-linear region, thereby generating a plurality of high order harmonic frequencies. The piezoelectric resonant film 130 has a piezoelectric effect. In other words, the mechanical property of the piezoelectric resonant film 130 will be changed when the electrical property thereof is changed; or the electrical property of the piezoelectric resonant film 130 will be changed when the mechanical property thereof is changed. The piezoelectric resonant film 130 can be made of PZT (Lead Zirconate Titanate). The MEMS resonator 100 can also include a substrate 110, but will not limited thereto.

Figure 5:
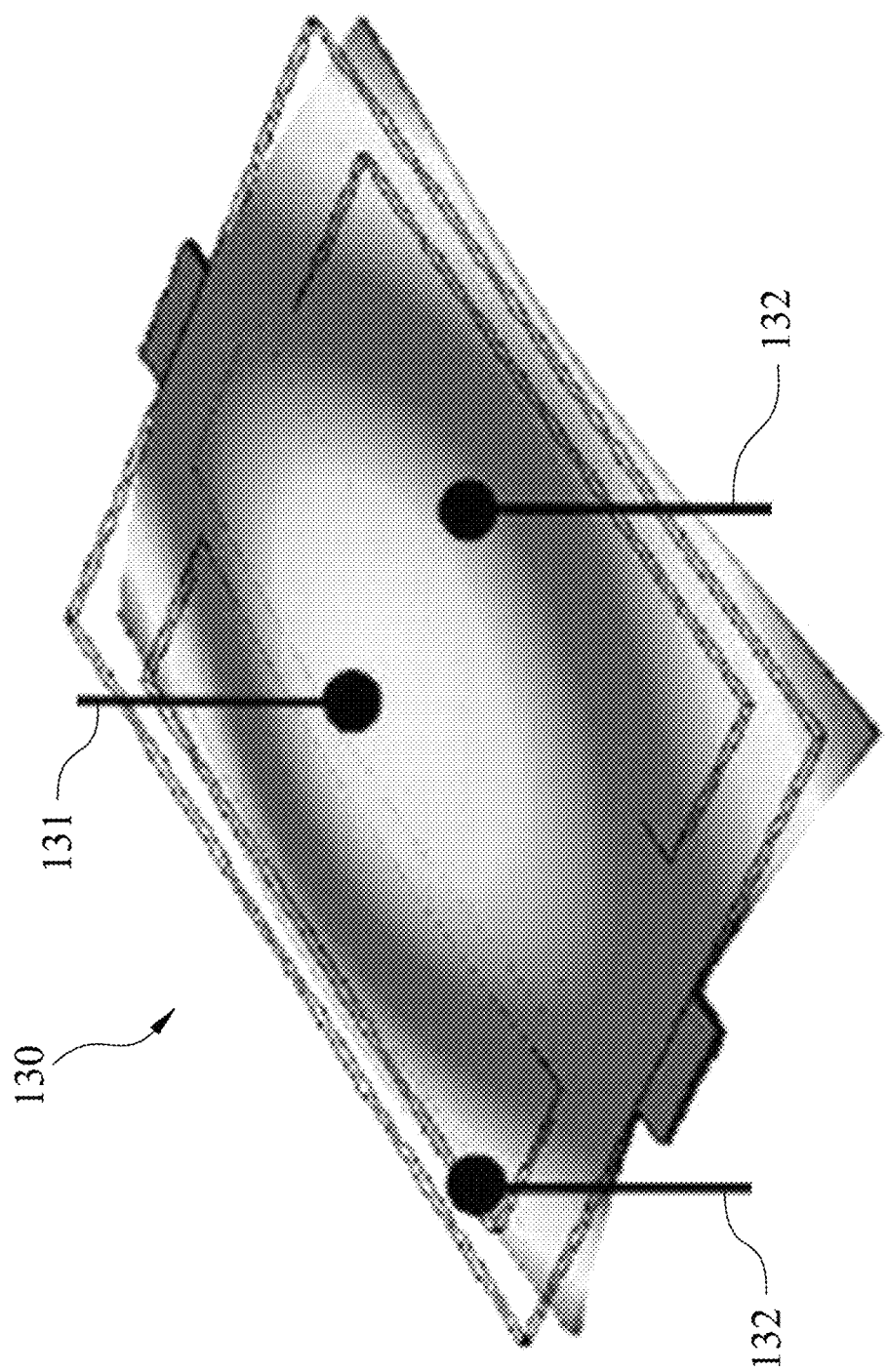
FIG. 5 shows a finite element analysis of the piezoelectric resonant film of FIG. 4.

FIG. 5 shows a finite element analysis of the piezoelectric resonant film 130 of FIG. 4. When performing a finite element analysis to the piezoelectric resonant film 130 of the MEMS resonator 100 of FIG. 4, a flapping mode frequency 714 kHz can be obtained. In FIG. 5, it is shown that when the MEMS resonator 100 oscillates, a displacement in a central region of the piezoelectric resonant film 130 is larger than a displacement in a side region of the piezoelectric resonant film 130. The displacement can be measured by a Laser Doppler Vibrometer (LDV). In other word, the central region of the piezoelectric resonant film 130 has a larger displacement and a higher oscillation speed, thereby defining an equivalent low stiffness region 131; the side region of the piezoelectric resonant film 130 has a smaller displacement and a lower oscillation speed, thereby defining an equivalent high stiffness region 132.

Figure 7:
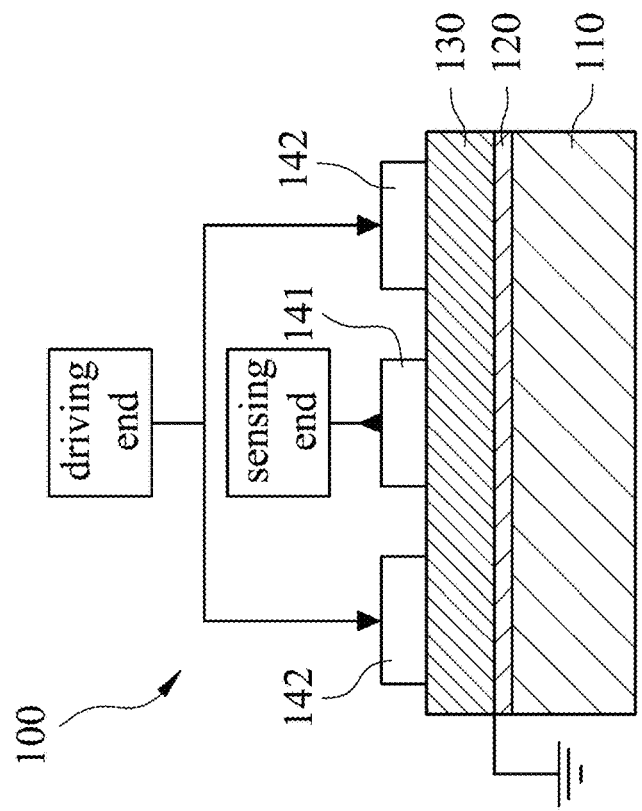
FIG. 7 is a schematic view showing that the MEMS resonator of FIG. 4 driven from an equivalent high stiffness region.
Figure 6:
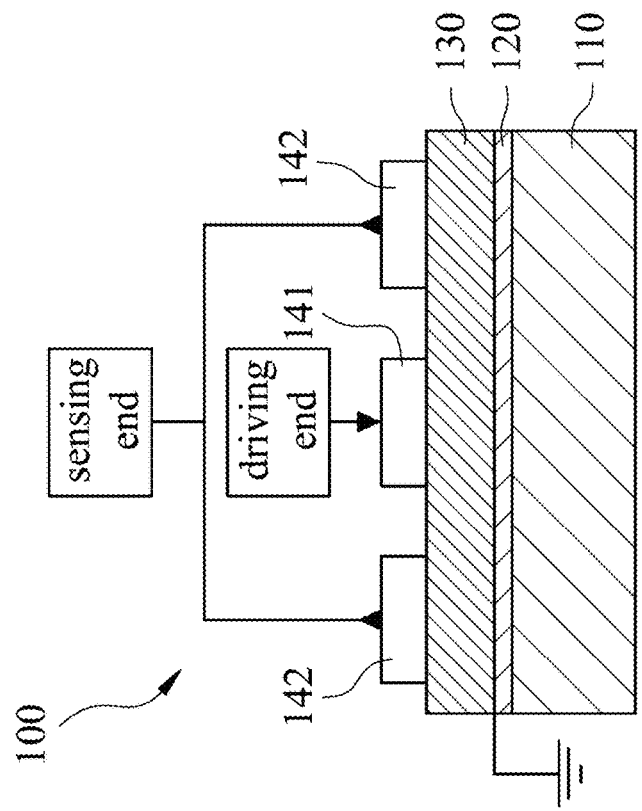
FIG. 6 is a schematic view showing that the MEMS resonator of FIG. 4 driven from an equivalent low stiffness region.

FIG. 6 is a schematic view showing that the MEMS resonator 100 of FIG. 4 driven from the equivalent low stiffness region 131. FIG. 7 is a schematic view showing that the MEMS resonator 100 of FIG. 4 driven from the equivalent high stiffness region 132. In FIG. 6, a driving signal is inputted from the first top electrode 141 and a measured signal is outputted from the second top electrode 142, therefore, the first top electrode 141 can be viewed as a driving end, and the second top electrode 142 can be viewed as a sensing end. The bottom electrode 120 is connected to a ground. Since the first top electrode 141 is used for inputting the driving signal and is located on the equivalent low stiffness region 131 of the piezoelectric resonant film 130, and the second top electrode 142 is used for outputting the measured signal and is located on the equivalent high stiffness region 132 of the piezoelectric resonant film 130 (FIG. 5, the equivalent low stiffness region 131 and the equivalent high stiffness region 132), the MEMS resonator 100 is driven from the equivalent low stiffness region 131. In contrast, in FIG. 7, the driving signal is inputted from the second top electrode 142 and the measured signal is outputted from the first top electrode 141, therefore, the first top electrode 141 can be viewed as a sensing end, and the second top electrode 142 can be viewed as a driving end. Since the second top electrode 142 is used for inputting the driving signal and is located on the equivalent high stiffness region 132 of the piezoelectric resonant film 130, and the first top electrode 141 is used for outputting the measured signal and is located on the equivalent low stiffness region 131 of the piezoelectric resonant film 130 (FIG. 5, the equivalent low stiffness region 131 and the equivalent high stiffness region 132), the MEMS resonator 100 is driven from the equivalent high stiffness region 132.

Figure 8:
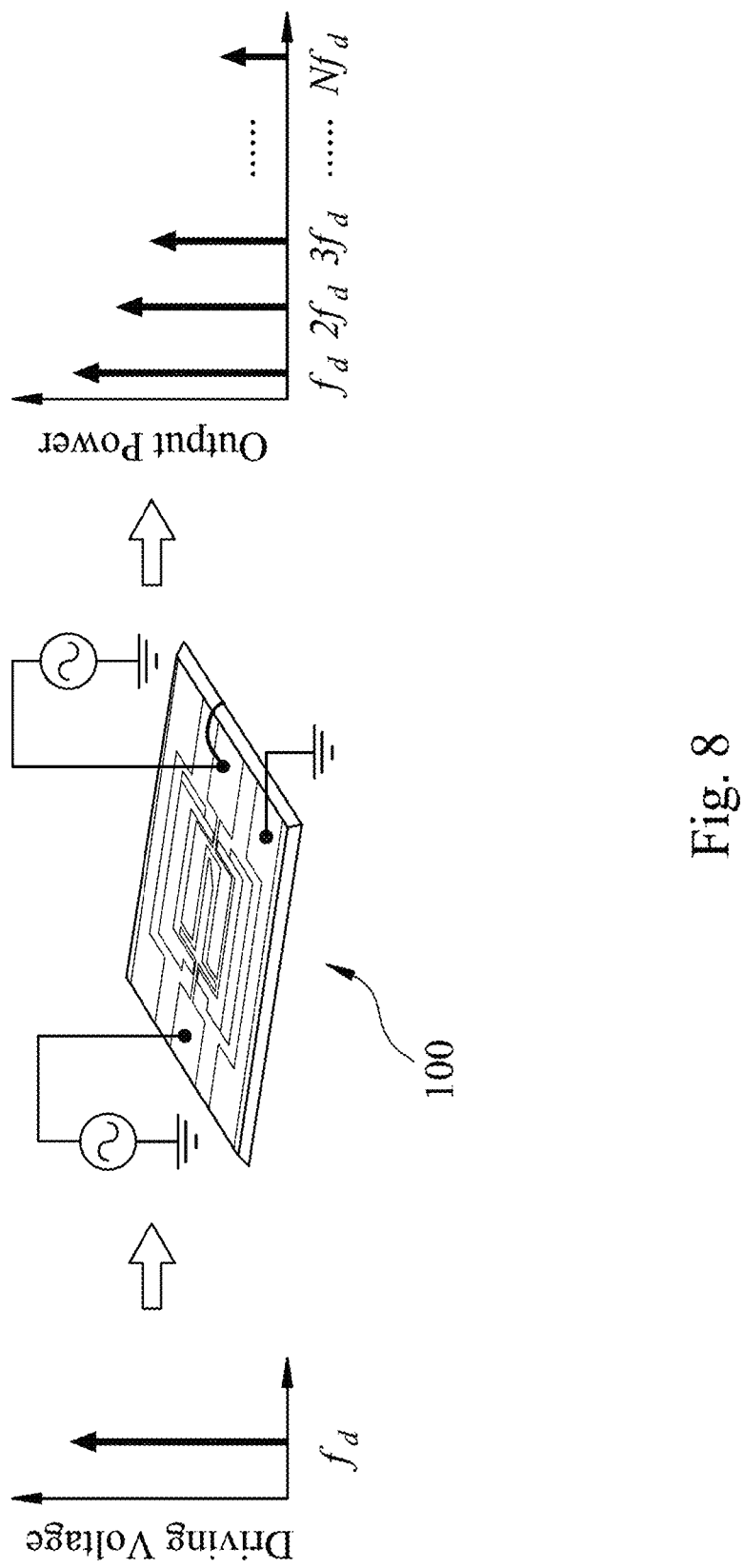
FIG. 8 is a schematic view showing that a plurality of high order harmonic frequencies generated by using the MEMS resonator of FIG. 4.

FIG. 8 is a schematic view showing that a plurality of high order harmonic frequencies generated by using the MEMS resonator 100 of FIG. 4. In FIG. 8, a driving signal with a single tone frequency (fd) is inputted from the first top electrode 141 or the second top electrode 142, the MEMS resonator 100 can oscillate in a non-linear region and a plurality of high order harmonic frequencies can be generated.

Figure 9:
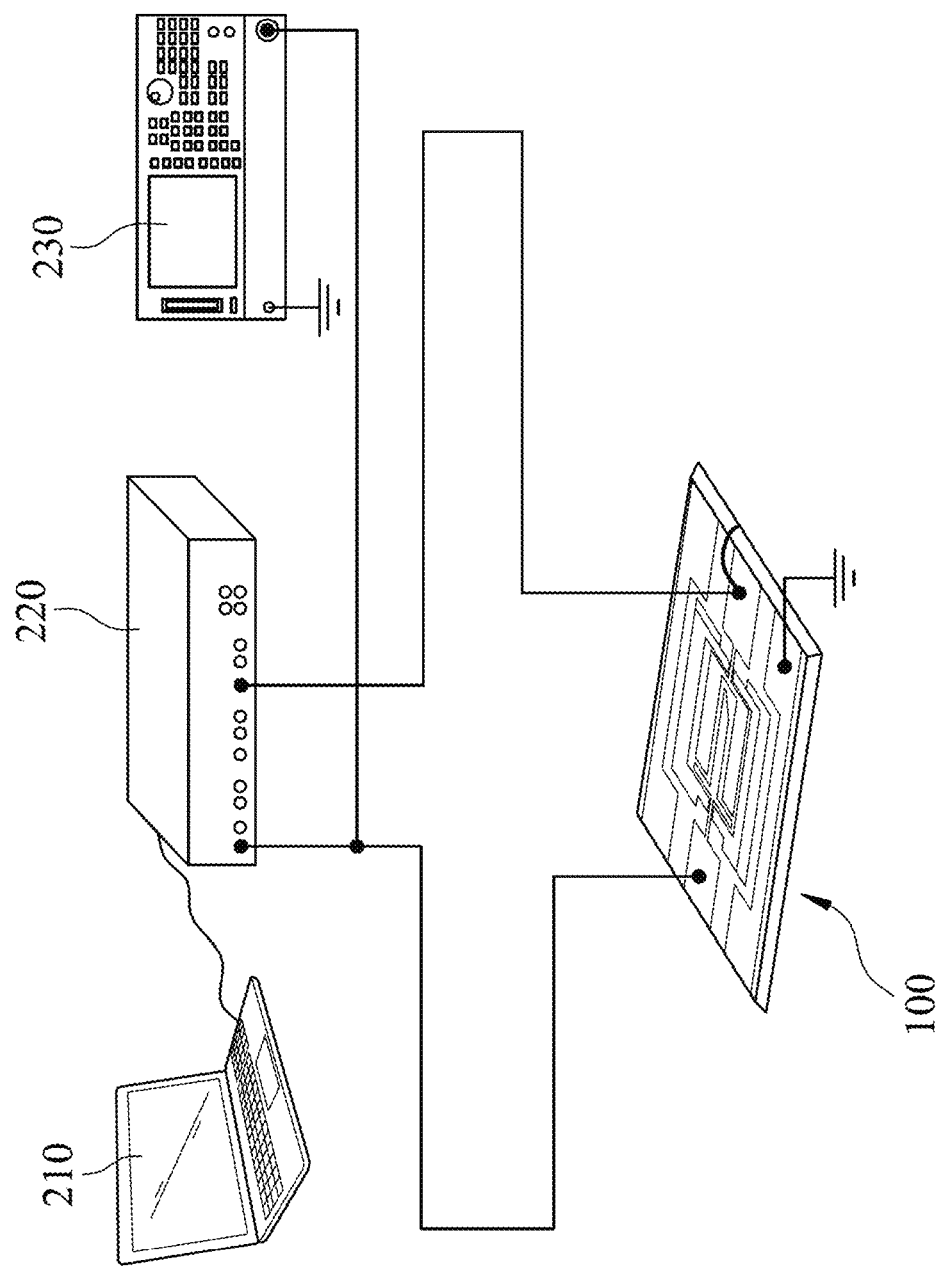
FIG. 9 is schematic view showing a measurement system of the MEMS resonator according to one embodiment of the present disclosure.

FIG. 9 is schematic view showing a measurement system of the MEMS resonator 100 according to one embodiment of the present disclosure. The measurement system includes a lock-in amplifier 220. The lock-in amplifier 220 is used to provide a driving signal with a single tone frequency or a frequency sweep range. The MEMS resonator 100 can be driven from the equivalent low stiffness region 131 or the equivalent high stiffness region 132, as shown in FIG. 6 and FIG. 7. The measurement system can further include an operation unit 210 and a spectrum analyzer 230. The operation unit 210 can be used to control the driving signal generated from the lock-in amplifier 220. The spectrum analyzer 230 can be used to analyze a frequency distribution when the MEMS resonator 100 oscillates.

Figure 10:
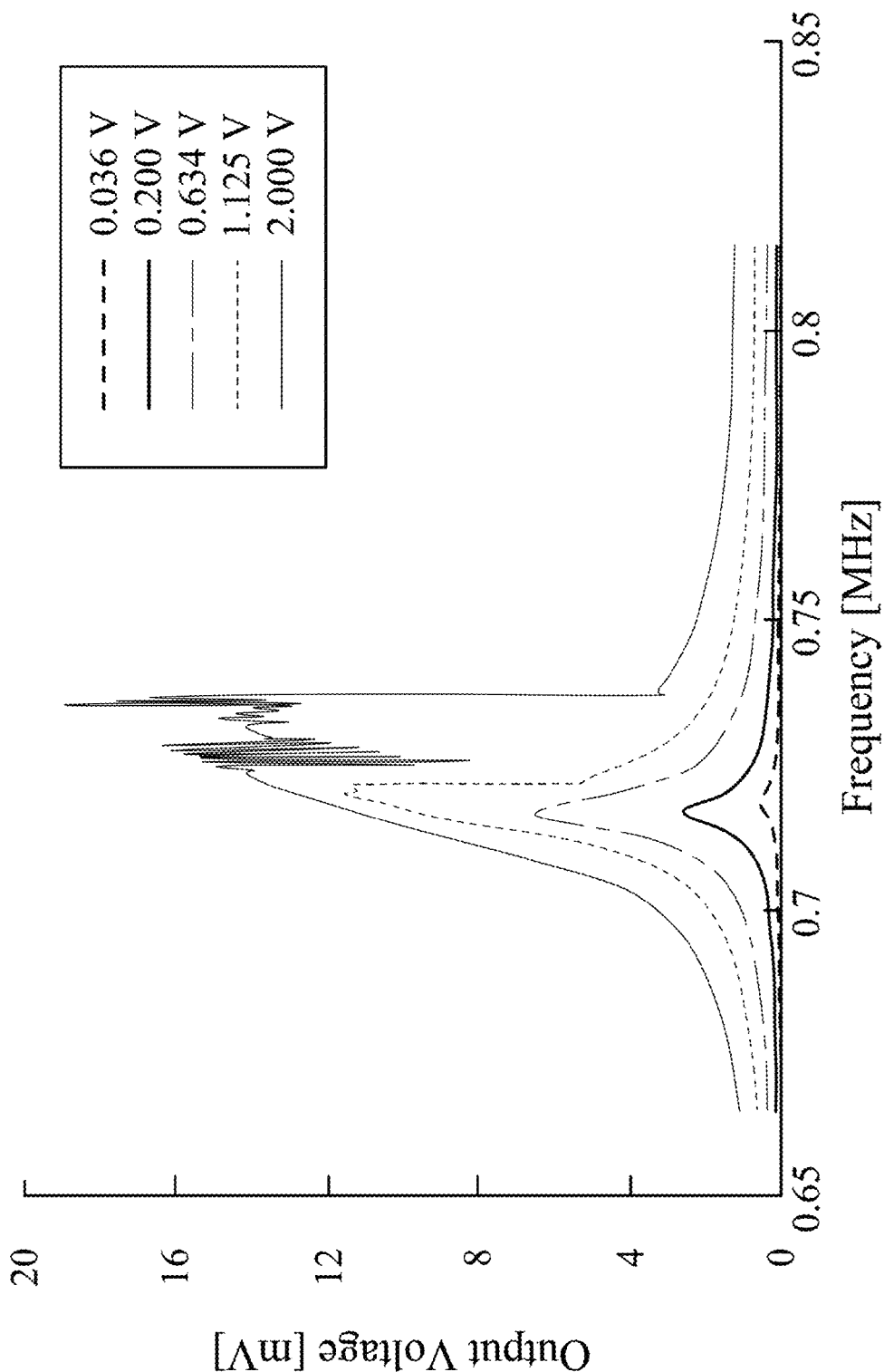
FIG. 10 is a schematic view showing a non-linear performance of a MEMS resonator driven form an equivalent low stiffness region and under a forward frequency sweep range according to one embodiment of the present disclosure.
Figure 11:
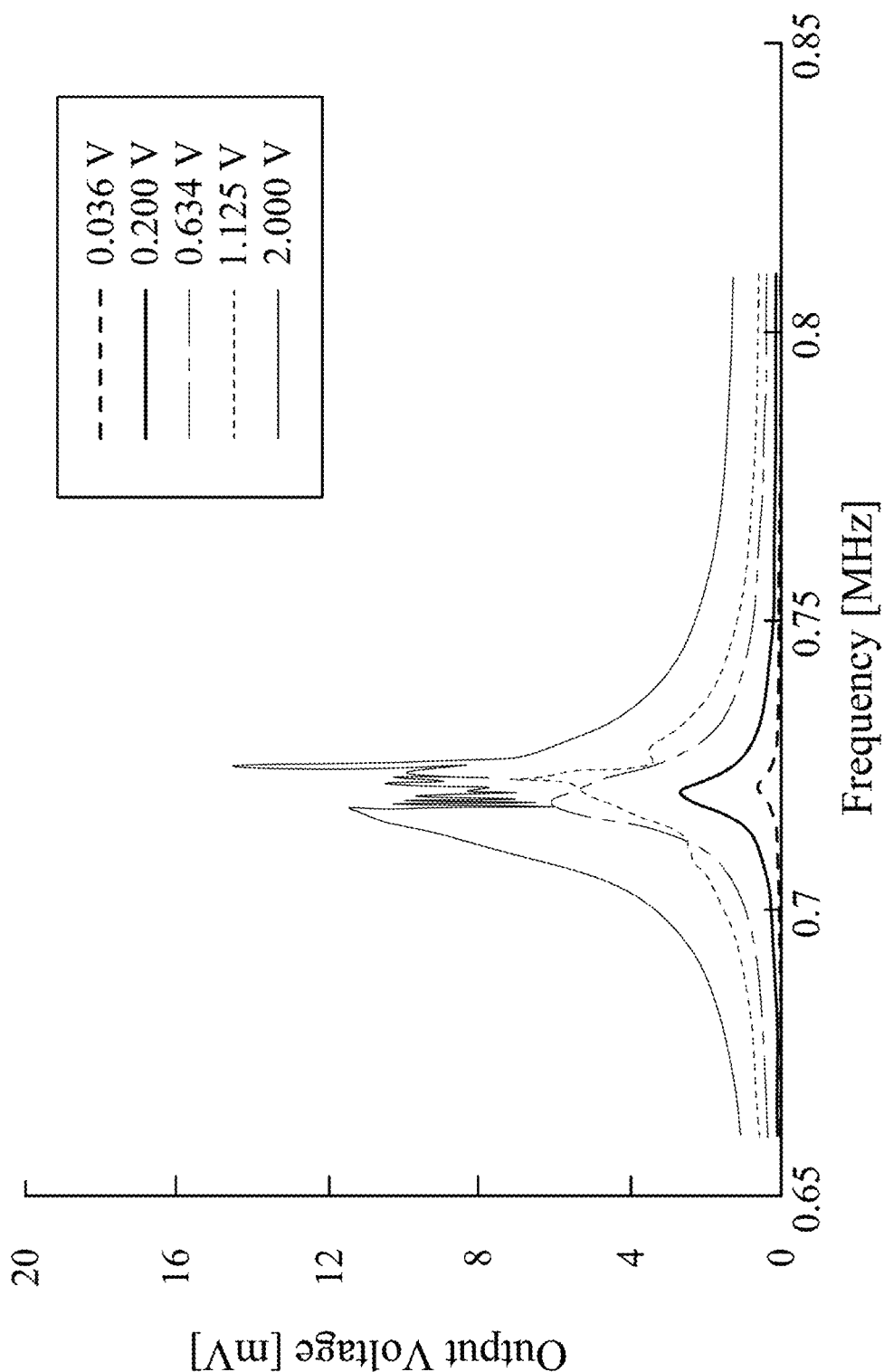
FIG. 11 is a schematic view showing a non-linear performance of a MEMS resonator driven form an equivalent low stiffness region and under a reverse frequency sweep range according to one embodiment of the present disclosure.
Figure 12:
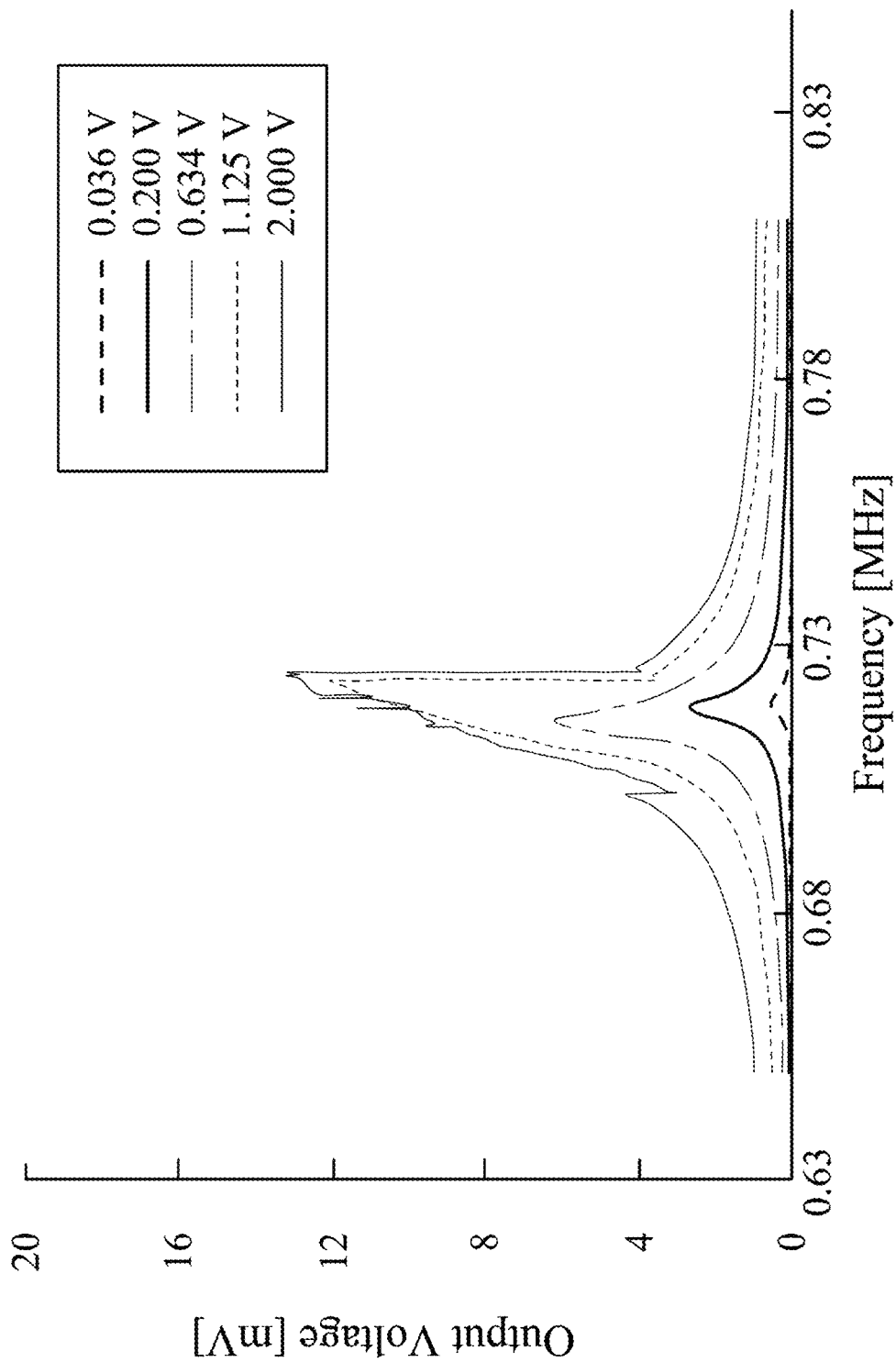
FIG. 12 is a schematic view showing a non-linear performance of a MEMS resonator driven form an equivalent high stiffness region and under a forward frequency sweep range according to one embodiment of the present disclosure.
Figure 13:
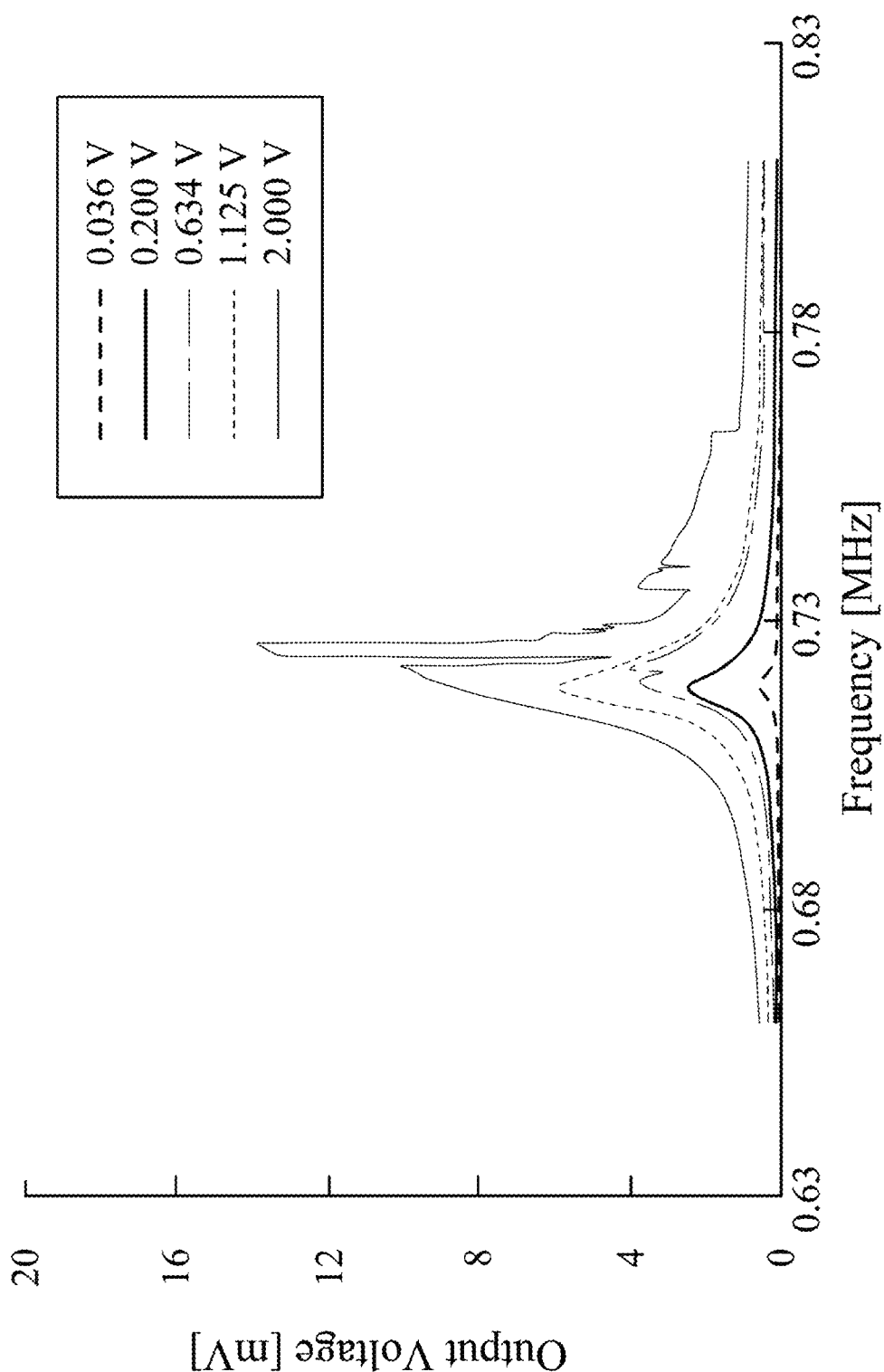
FIG. 13 is a schematic view showing a non-linear performance of a MEMS resonator driven form an equivalent high stiffness region and under a reverse frequency sweep range according to one embodiment of the present disclosure.

FIG. 10 is a schematic view showing a non-linear performance of a MEMS resonator 100 driven form an equivalent low stiffness region 131 and under a forward frequency sweep range according to one embodiment of the present disclosure. FIG. 11 is a schematic view showing a non-linear performance of a MEMS resonator 100 driven form an equivalent low stiffness region 131 and under a reverse frequency sweep range according to one embodiment of the present disclosure. FIG. 12 is a schematic view showing a non-linear performance of a MEMS resonator 100 driven form the equivalent high stiffness region 132 and under a forward frequency sweep range according to one embodiment of the present disclosure. FIG. 13 is a schematic view showing a non-linear performance of a MEMS resonator 100 driven form the equivalent high stiffness region 132 and under a reverse frequency sweep range according to one embodiment of the present disclosure. Two types of frequency sweep ranges are used for evaluating the non-linear performance of the MEMS resonator 100. Furthermore, the piezoelectric resonant film 130 of the MEMS resonator 100 is driven from the equivalent low stiffness region 131 and the equivalent high stiffness region 132 for evaluating the non-linear performance of the MEMS resonator 100. The forward frequency sweep range means that the frequency is swept from a low frequency to a high frequency, and the reverse frequency sweep range means that the frequency is swept from a high frequency to a low frequency. In FIGS. 10 to 13, four driving mode are used. The driving signals generated form the lock-in amplifier 220 are AC signals, and the voltage values of the driving signals are 0.036 V, 0.200 V, 0.643 V, 1.125 V and 2.000 V, respectively. The measurements are performed under the forward frequency sweep range and the reverse frequency sweep range. In a small driving signal 0.036 V, the oscillation frequency in a non-linear region of the MEMS resonator 100 can be observed in four driving mode. When the driving signal is increased, the non-linear performances of the four driving modes are different. In sum, a better non-linear performance is occurred under the forward frequency sweep range. Furthermore, the non-linear performance when driven from the equivalent low stiffness region 131 is better than driven from the equivalent high stiffness region 132. For example, the non-linear performance and the output voltage values under the forward frequency sweep range and driven from the equivalent low stiffness region 131 in FIG. 10 is higher than the non-linear performance and the output voltage values under the reverse frequency sweep range and driven from the equivalent high stiffness region 132 in FIG. 13.

Figure 14:
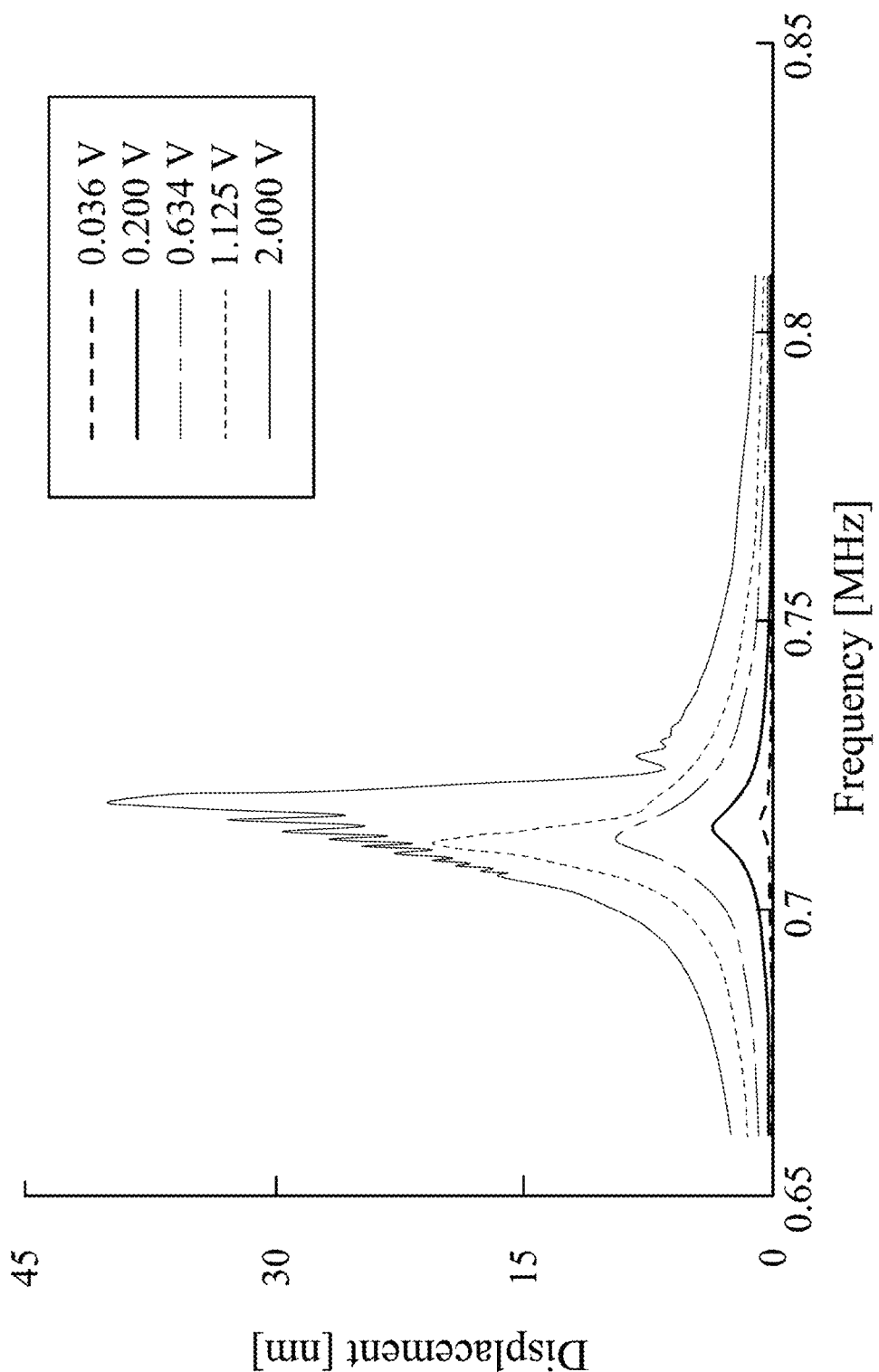
FIG. 14 is a schematic view showing a relationship between a displacement and a frequency of a MEMS resonator according to one embodiment of the present disclosure.

FIG. 14 is a schematic view showing a relationship between a displacement and a frequency of a MEMS resonator 100 according to one embodiment of the present disclosure. The displacement of the MEMS resonator 100 when the MEMS resonator 100 oscillates can be measured by a LDV method. The variety between the displacement and the frequency show a non-linear performance and the result is corresponded to the best non-linear performance of the driving mode in FIG. 10.

Figure 15:
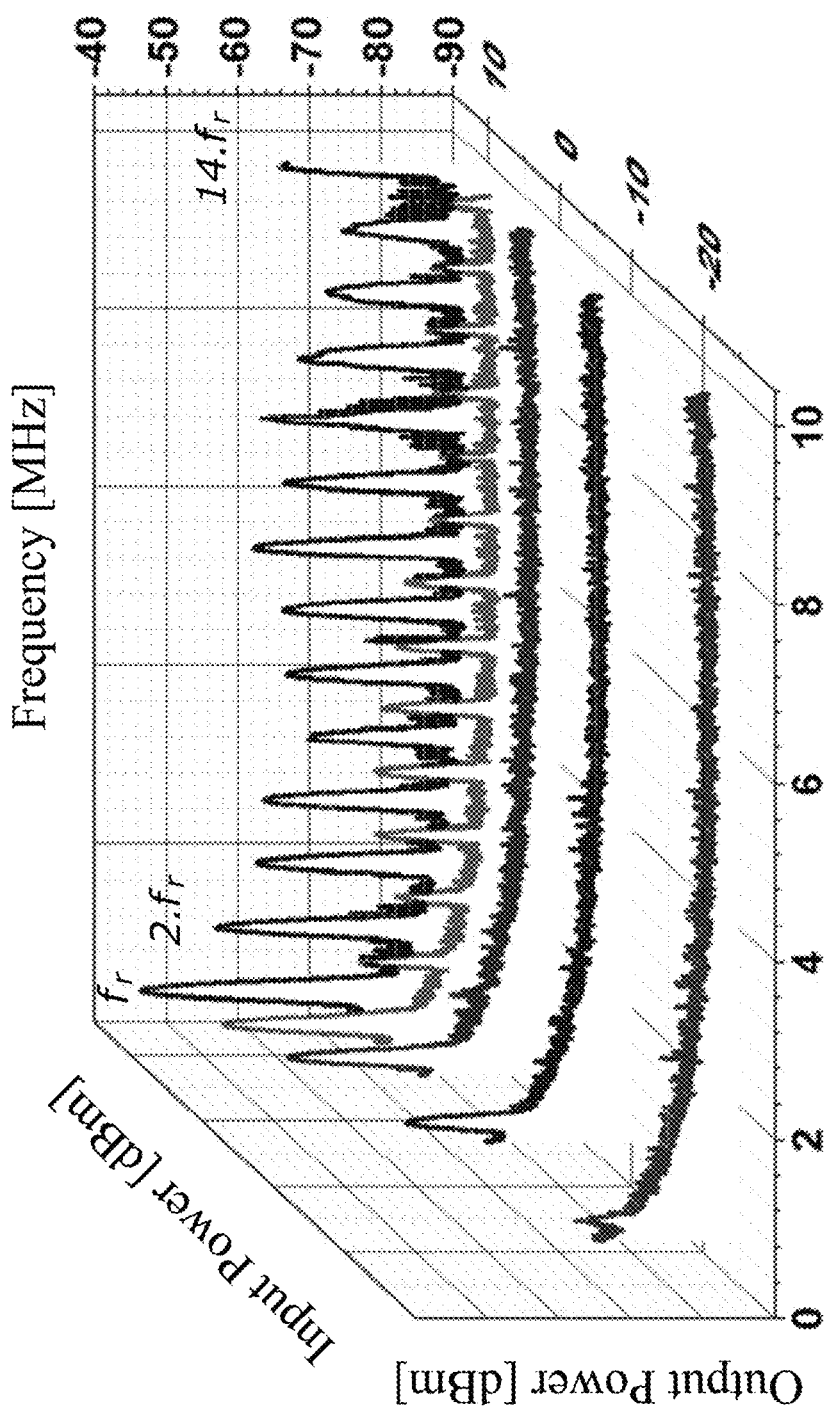
FIG. 15 is a schematic view showing a spectrum of a MEMS resonator driven form an equivalent low stiffness region and under a forward frequency sweep range according to one embodiment of the present disclosure.
Figure 16:
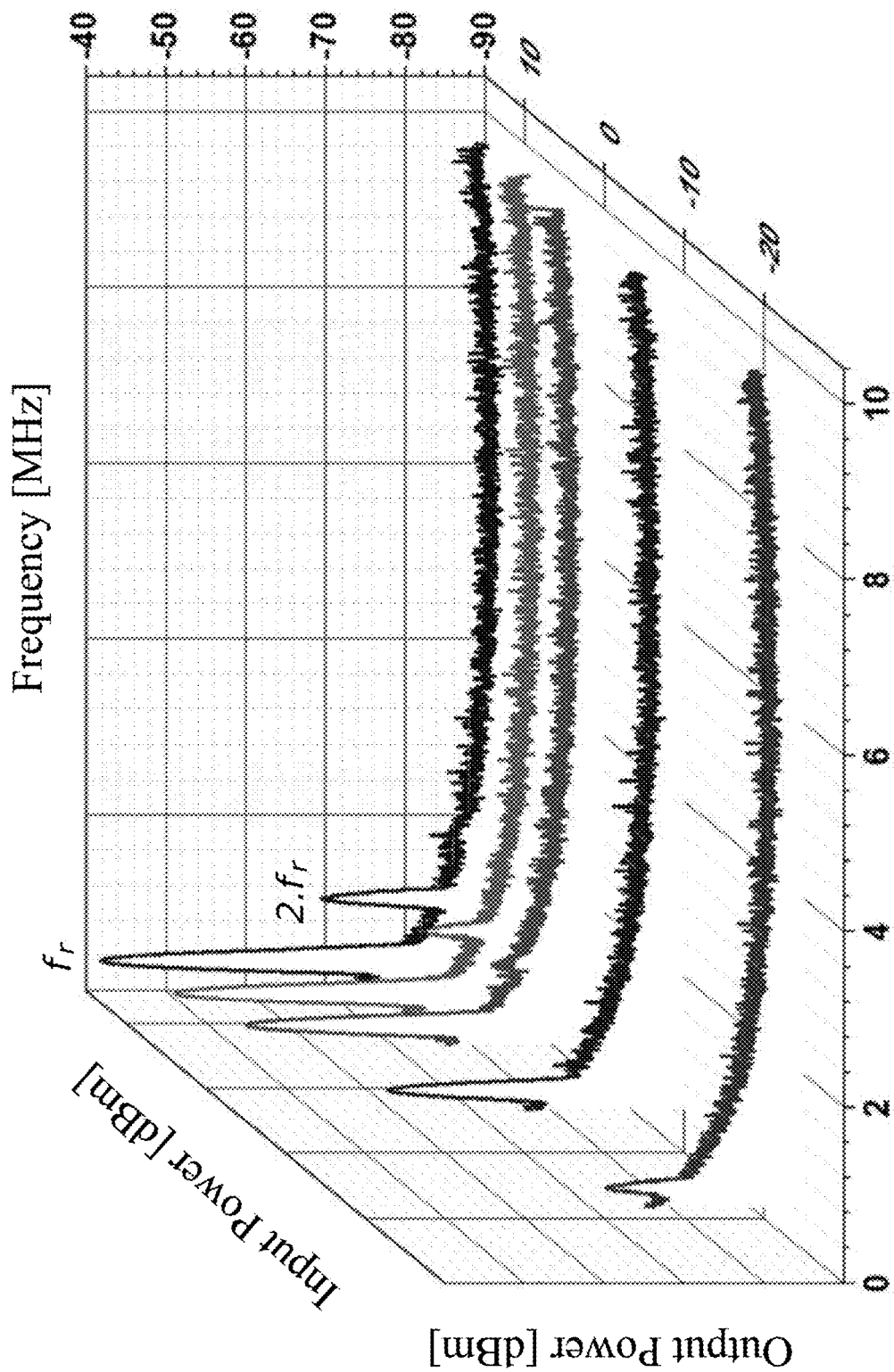
FIG. 16 is a schematic view showing a spectrum of a MEMS resonator driven form an equivalent high stiffness region and under a reverse frequency sweep range according to one embodiment of the present disclosure.

FIG. 15 is a schematic view showing a spectrum of a MEMS resonator 100 driven form an equivalent low stiffness region 131 and under a forward frequency sweep range according to one embodiment of the present disclosure. FIG. 16 is a schematic view showing a spectrum of a MEMS resonator 100 driven form an equivalent high stiffness region 132 and under a reverse frequency sweep range according to one embodiment of the present disclosure. In FIG. 15, when the driving signal is 36 mV and the resonance frequency is ±50 kHz under the forward frequency sweep range, only base frequency can be observed, no high order harmonic frequencies are generated. When the driving signal is increased, the quantity of the high order harmonic frequencies is increased. When the driving signal is increased to 634 mV, a second order harmonic frequency can be observed. When the driving signal is increased to 2 V, large quantity of the high order harmonic frequencies is generated, fourteen high order harmonic frequencies can be observed. In FIG. 16, the spectrum of the MEMS resonator 100 driven form the equivalent high stiffness region 132 and under the reverse frequency sweep range is used for comparison. It can be observed that the quantity of the high order harmonic frequencies in FIG. 16 is smaller than that in FIG. 15. In FIG. 16, only two high order harmonic frequencies can be observed even the driving signal is increased to 2 V. The aforementioned embodiments show that when the driving signal is smaller, the MEMS resonator 100 oscillates in a linear region; when the driving signal is increased, high order harmonic frequencies are generated in a non-linear region of the MEMS resonator 100.

Figure 17:
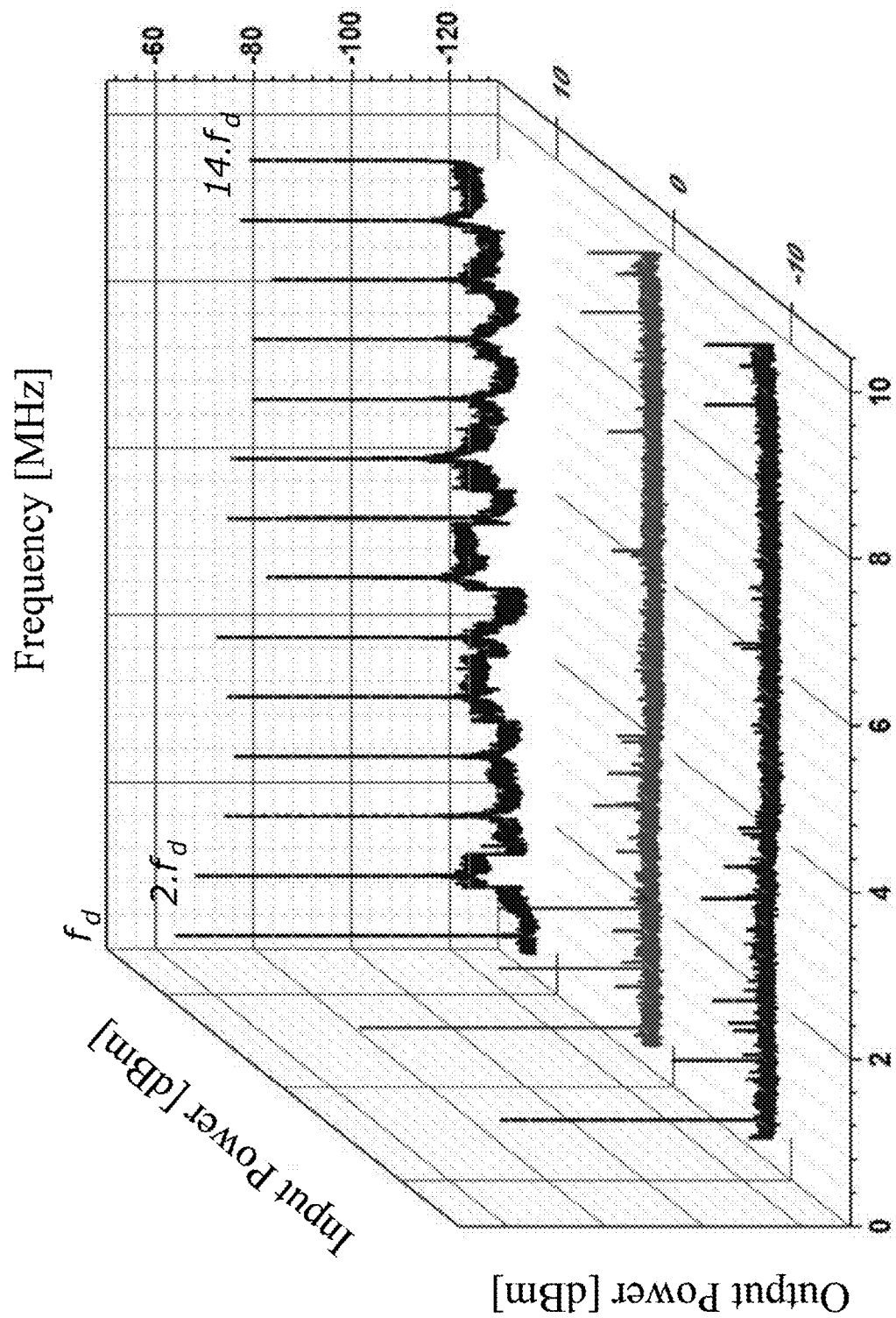
FIG. 17 is a schematic view showing a spectrum of a MEMS resonator driven form an equivalent low stiffness region and under a single tone frequency according to one embodiment of the present disclosure.

FIG. 17 is a schematic view showing a spectrum of a MEMS resonator 100 driven form an equivalent low stiffness region 131 and under a single tone frequency according to one embodiment of the present disclosure. In FIG. 15 and FIG. 16, the driving signal is a frequency sweep range. In FIG. 17, the driving signal is a single tone frequency. In can also be observed that high order harmonic frequencies are also can be generated in FIG. 17. From FIG. 15, FIG. 16 and FIG. 17, it is shown that the high order harmonic frequencies can be generated when the driving signal is a single tone frequency or a frequency sweep range. Furthermore, the quantity of the high order harmonic frequencies when driven from the equivalent low stiffness region 131 is larger than driven from the equivalent high stiffness region 132.

Figure 18:
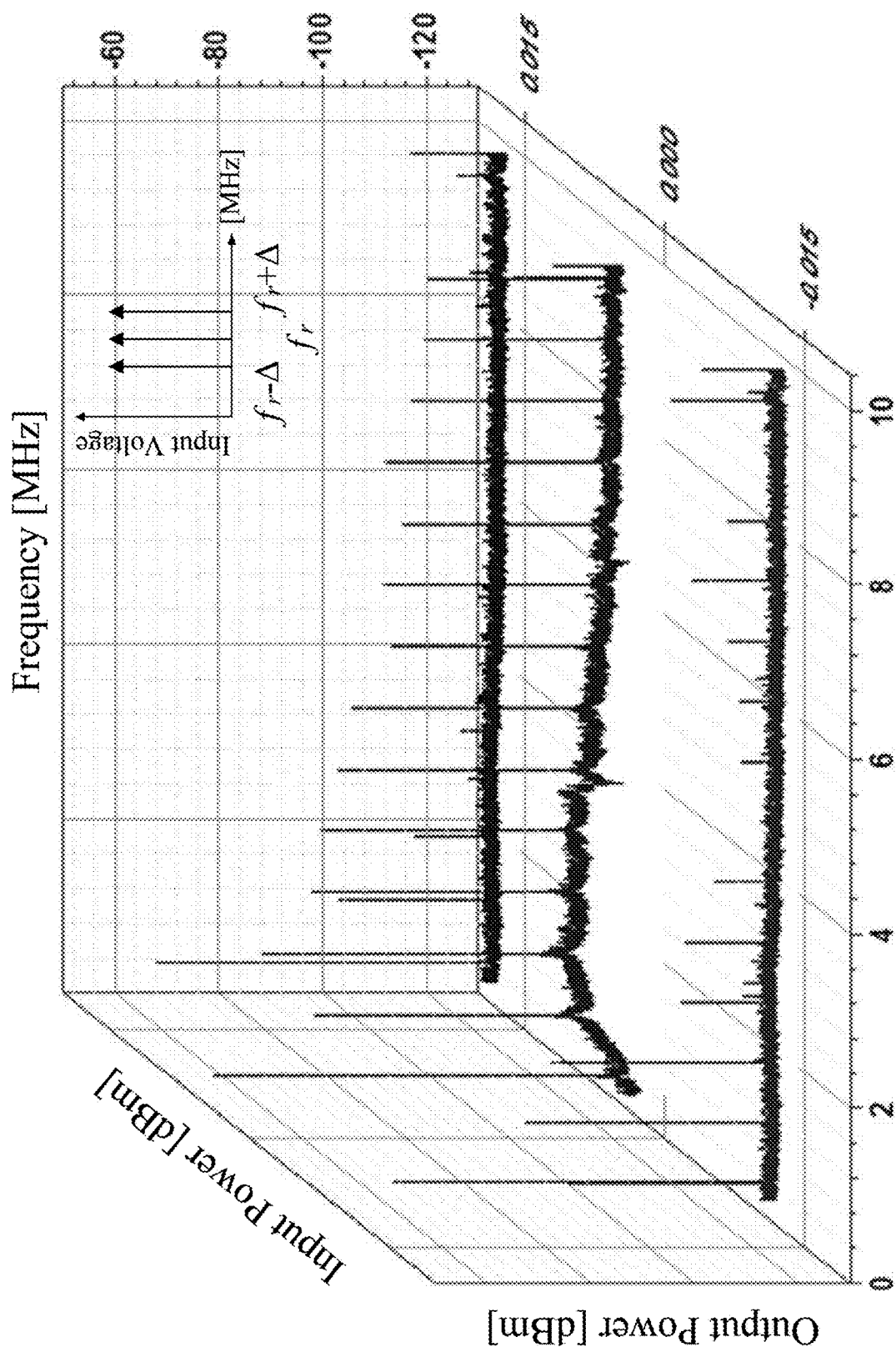
FIG. 18 is a schematic showing that a plurality of high order harmonic frequencies generated by controlling resonant frequency offset of a MEMS resonator.

FIG. 18 is a schematic showing that a plurality of high order harmonic frequencies generated by controlling a resonance frequency offset of the MEMS resonator 100. In FIG. 18, it is shown that the non-linear performance of the MEMS resonator 100 is adjustable by adjusting the resonance frequency (fr) offset of the MEMS resonator 100. In other word, the quantity of the high order harmonic frequencies can be adjusted by adjusting the offset fr+Δ or fr−Δ of the resonance frequency fr of the MEMS resonator 100, where Δ is a selected frequency range. In FIG. 18, three specified frequencies (fr, fr±Δ (Δ~15 kHz)) are selected, and the MEMS resonator 100 is driven from the equivalent low stiffness region 131 for evaluating the non-linear performance of the MEMS resonator 100. It is shown that in the three specified frequencies, different quantities of high order harmonic frequencies are generated. Furthermore, a maximum quantity of high order harmonic frequencies is generated under an ideal frequency value. When a frequency value is away from the ideal frequency value, the quantity of the high order harmonic frequencies is smaller.

Figure 19:
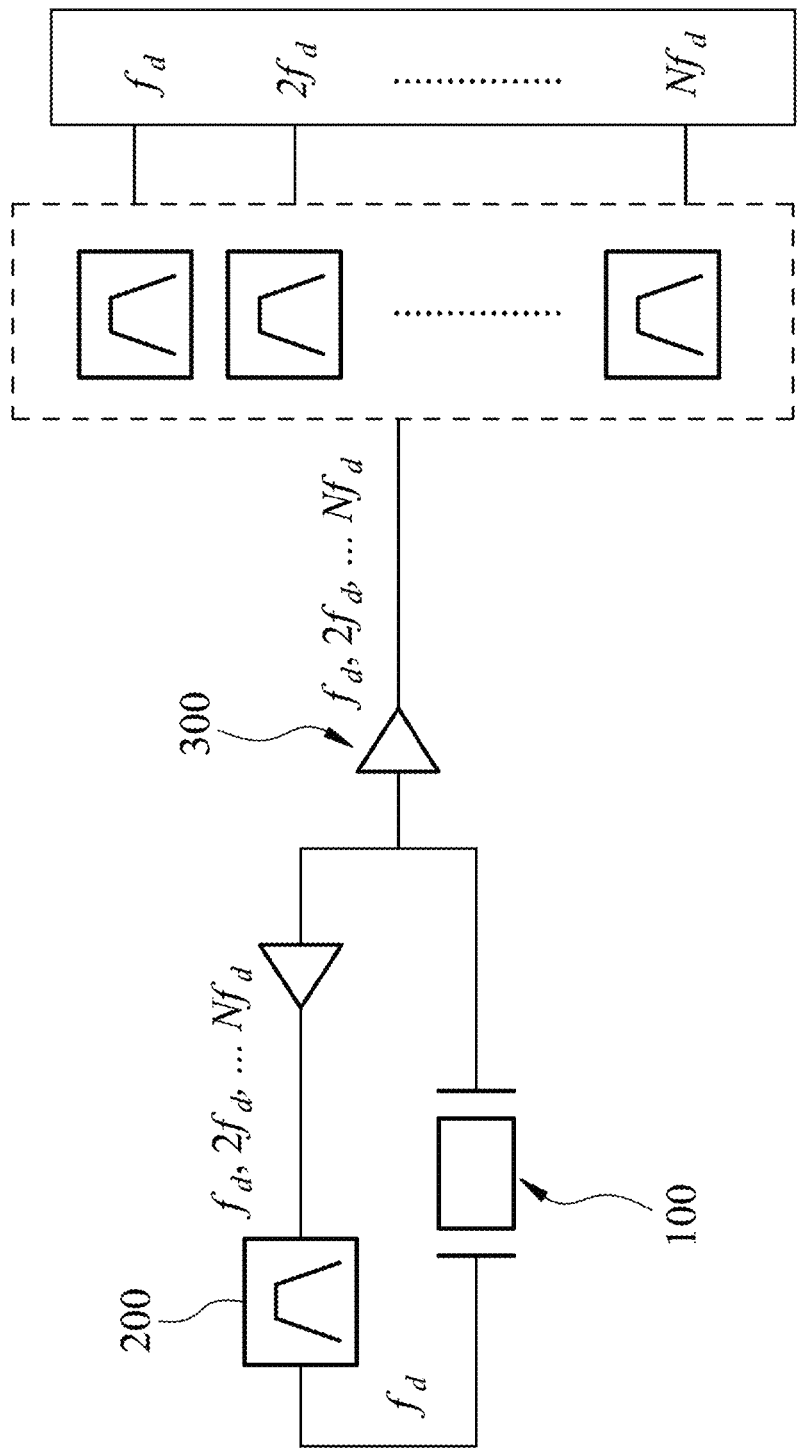
FIG. 19 is a schematic view showing a system on a chip that applying the method for generating high order harmonic frequencies of the present disclosure.

FIG. 19 is a schematic view showing a system on a chip that applying the method for generating high order harmonic frequencies of the present disclosure. In FIG. 19, a MEMS resonator 100, a gain amplifier 200 and a band-pass filter 300 are used to construct a system on a chip (SoC). The MEMS resonator 100 is operated in a base frequency. The outputted signal is amplified by the gain amplifier 200, and then feed back to the band-pass filter 300. The band-pass filter 300 can be used for generating high order harmonic frequencies. FIG. 19 shows that high order harmonic frequencies can be generated using only single MEMS resonator 100 instead of using multiple MEMS resonators 100.

Figure 20:
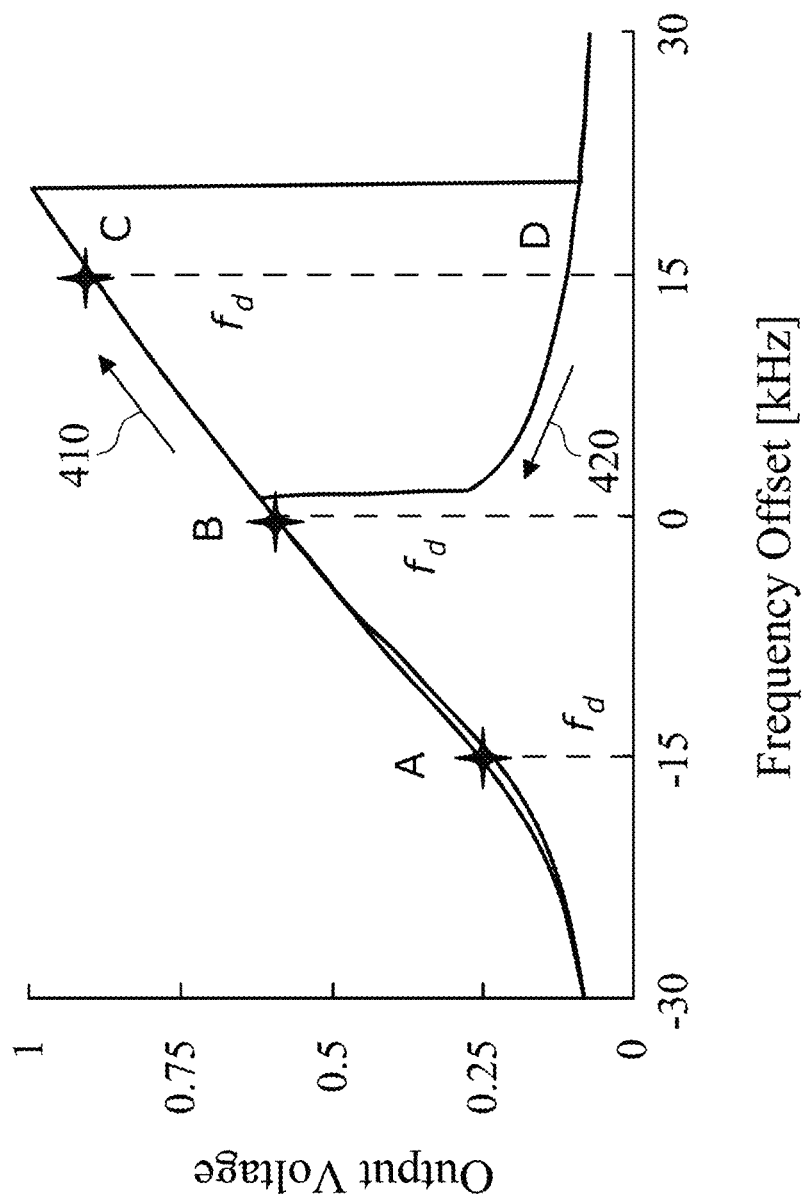
FIG. 20 is a schematic view showing that a plurality of high order harmonic frequencies generated by controlling a driving frequency offset.
Figure 21:
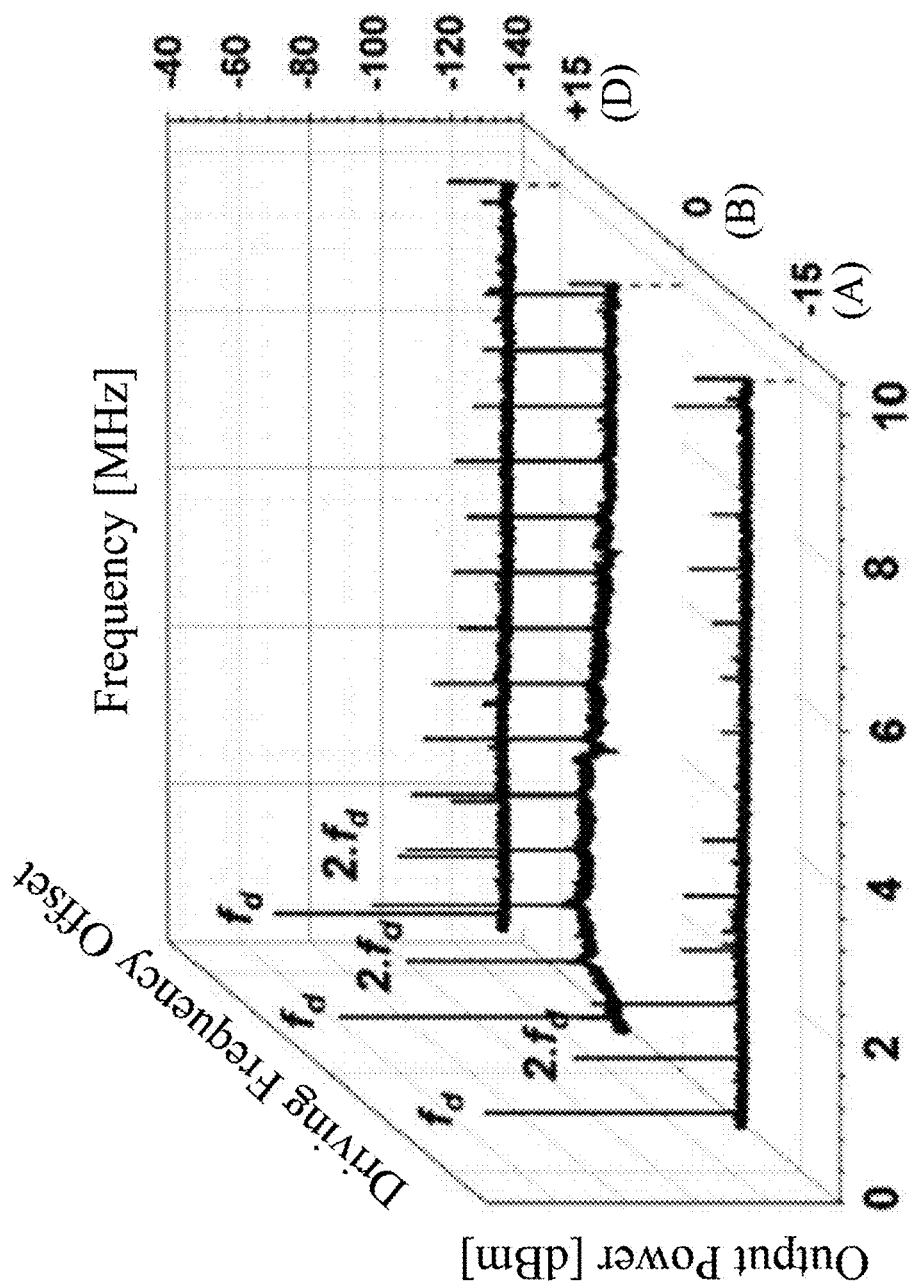
FIG. 21 is a spectrogram of FIG. 20.

FIG. 20 is a schematic view showing that a plurality of high order harmonic frequencies generated by controlling a driving frequency offset. FIG. 21 is a spectrogram of FIG. 20. In FIG. 20, it is shown that the quantity of the high order harmonic frequencies is adjustable by adjusting a frequency offset of the driving signal. It has been described that a driving signal with a single tone frequency can be used for generating the high order harmonic frequencies, and the quantity of the high order harmonic frequencies is larger when driven from the equivalent low stiffness region 131. In FIG. 20, the measure range of the single tone frequency can be a forward frequency sweep range (swept from negative to positive, arrow 410) or a reverse frequency sweep range (swept from positive to negative, arrow 420). In the electrical curve of FIG. 20, a hysteresis effect can be observed during different frequency sweep ranges. In other word, in the same frequency offset value (15 kHz), the output voltage have two different values, which are corresponded to a high energy point (point C) and a low energy point (point D) under different frequency sweep ranges (the forward frequency sweep range and the reverse frequency sweep range). In FIG. 21, it is shown that different quantities of high order harmonic frequencies are generated at different driving frequency offset values (point A, point B and point D). Therefore, by adjusting the frequency offset of the driving signal, the quantity of the high order harmonic frequencies can be adjusted.

Figure 22:
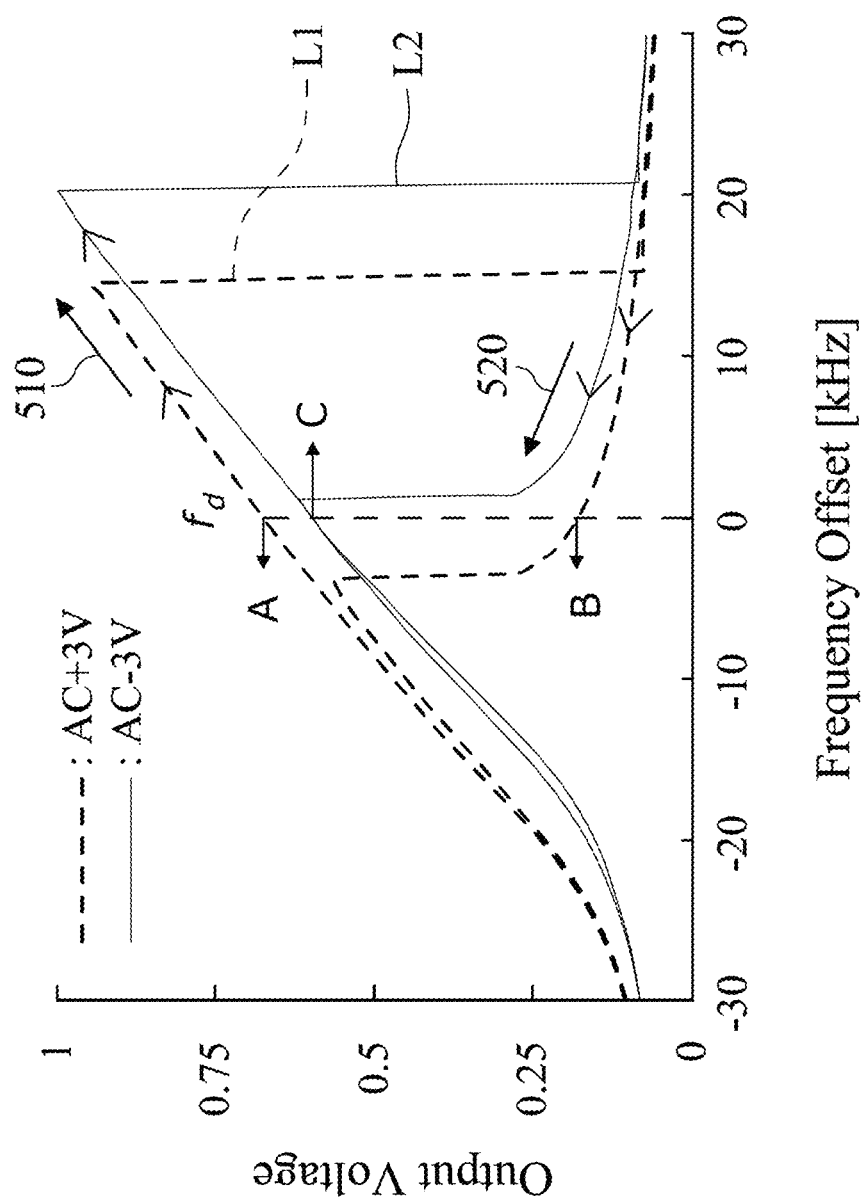
FIG. 22 is schematic view showing that the high order harmonic frequencies are adjustable by applying a DC bias.
Figure 23:
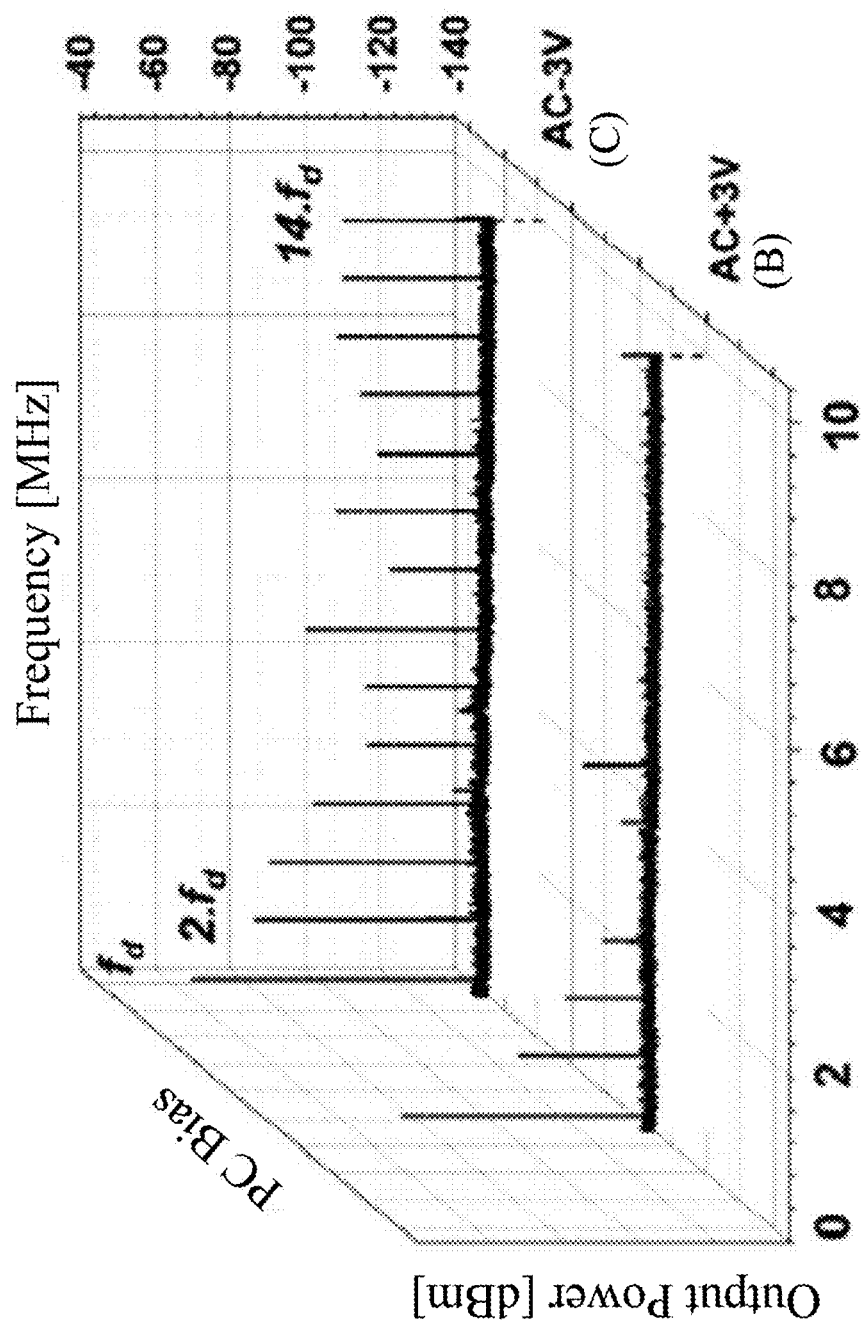
FIG. 23 is a spectrogram of FIG. 22.

FIG. 22 is schematic view showing that the high order harmonic frequencies are adjustable by applying a DC bias. FIG. 23 is a spectrogram of FIG. 22. In FIG. 22, it is shown that the quantity of the high order harmonic frequencies can be adjusted by applying a DC bias. Similar to FIG. 20, the frequency sweep range can be a forward frequency sweep range (swept from a low frequency to a high frequency, arrow 510) or a reverse frequency sweep range (swept from a high frequency to a low frequency, arrow 520). In FIG. 22, when applying a DC bias, a hysteresis effect can also be observed (point A, point B and point C). The curve L1 means applying a positive DC bias (+3V), the curve L2 means applying a negative DC bias (−3V). In FIG. 23, the quantity of the high order harmonic frequencies is different under different polarity of the DC bias. Therefore, the quantity of the high order harmonic frequencies can be adjusted by adjusting the polarity of the DC bias.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for generating high order harmonic frequencies, the method comprising:
   providing a piezoelectric resonant film; and
   inputting a driving signal with a single tone frequency for driving the piezoelectric resonant film to oscillate in a non-linear region so as to generate a plurality of high order harmonic frequencies;
   wherein the high order harmonic frequencies are corresponding to a plurality of harmonics, and the harmonics comprise of a non-Eigen mode as well.

2. The method of claim 1, wherein the piezoelectric resonant film comprises an equivalent high stiffness region and an equivalent low stiffness region, and the method further comprises:
   driving the piezoelectric resonant film from the equivalent high stiffness region or the equivalent low stiffness region.

3. The method of claim 2, wherein a quantity of the high order harmonic frequencies driven from the equivalent low stiffness region is greater than a quantity of the high order harmonic frequencies driven from the equivalent high stiffness region.

4. The method of claim 1, further comprising:
   controlling the single tone frequency for adjusting a quantity of the high order harmonic frequencies.

5. The method of claim 1, further comprising:
   adjusting a frequency offset of the driving signal for adjusting a quantity of the high order harmonic frequencies.

6. A method for generating high order harmonic frequencies, the method comprising:

providing a piezoelectric resonant film; and
inputting a driving signal with a frequency sweep range for driving the piezoelectric resonant film to oscillate in a non-linear region so as to generate a plurality of high order harmonic frequencies;
wherein the high order harmonic frequencies are corresponding to a plurality of harmonics, and the harmonics comprise of a non-Eigen mode as well.

7. The method of claim 6, wherein the frequency sweep range is a forward frequency sweep range that sweeps from a low frequency to a high frequency.

8. The method of claim 6, wherein the frequency sweep range is a reverse frequency sweep range that sweeps from a high frequency to a low frequency.

9. The method of claim 6, wherein the piezoelectric resonant film comprises an equivalent high stiffness region and an equivalent low stiffness region, and the method further comprises:
driving the piezoelectric resonant film from the equivalent high stiffness region or the equivalent low stiffness region.

10. The method of claim 9, wherein a quantity of the high order harmonic frequencies driven from the equivalent low stiffness region is greater than a quantity of the high order harmonic frequencies driven from the equivalent high stiffness region.

11. The method of claim 6, further comprising:
controlling the frequency sweep range for adjusting a quantity of the high order harmonic frequencies.

12. A method for generating high order harmonic frequencies, the method comprising:
providing a piezoelectric resonant film;
inputting a driving signal to the piezoelectric resonant film for driving the piezoelectric resonant film to oscillate in a non-linear region so as to generate a plurality of high order harmonic frequencies; and
inputting a DC bias to the piezoelectric resonant film for adjusting a quantity of the high order harmonic frequencies.

13. The method of claim 12, further comprising:
adjusting a polarity of the DC bias for adjusting the quantity of the high order harmonic frequencies.

14. A MEMS resonator, comprising:
a bottom electrode;
a piezoelectric resonant film located on the bottom electrode, wherein the piezoelectric resonant film comprises an equivalent high stiffness region and an equivalent low stiffness region;
a first top electrode located on the equivalent low stiffness region; and
a second top electrode located on the equivalent high stiffness region;
wherein a driving signal is inputted from the first top electrode or the second top electrode for driving the piezoelectric resonant film to oscillate in a non-linear region so as to generate a plurality of high order harmonic frequencies;
wherein the high order harmonic frequencies are corresponding to a plurality of harmonics, and the harmonics comprise of a non-Eigen mode as well.

15. The MEMS resonator of claim 14, wherein the MEMS resonator is made of a PZT.

\* \* \* \* \*